US008266567B2

(12) United States Patent
El Yahyaoui et al.

(10) Patent No.: US 8,266,567 B2
(45) Date of Patent: Sep. 11, 2012

(54) SEMICONDUCTOR LAYOUT MODIFICATION METHOD BASED ON DESIGN RULE AND USER CONSTRAINTS

(75) Inventors: Farid El Yahyaoui, NJ Helmond (NL); Jozefus Godefridus Gerardus Van Gisbergen, BD Hiivarenbeek (NL)

(73) Assignee: Sagantec Israel Ltd., Tirat Carmel (IL)

( * ) Notice: Subject to any disclaimer, the term of this patent is extended or adjusted under 35 U.S.C. 154(b) by 244 days.

(21) Appl. No.: 12/666,988

(22) PCT Filed: Jun. 30, 2008

(86) PCT No.: PCT/EP2008/058372
§ 371 (c)(1),
(2), (4) Date: Dec. 28, 2009

(87) PCT Pub. No.: WO2009/000934
PCT Pub. Date: Dec. 31, 2008

(65) Prior Publication Data
US 2010/0199235 A1      Aug. 5, 2010

(30) Foreign Application Priority Data
Jun. 28, 2007   (EP) .................................... 07111309

(51) Int. Cl.
*G06F 17/50* (2006.01)
*G06F 9/455* (2006.01)
(52) U.S. Cl. ........... 716/122; 716/55; 716/118; 716/119
(58) Field of Classification Search .......... 716/118–119, 716/122–126, 129–131
See application file for complete search history.

(56) References Cited

U.S. PATENT DOCUMENTS

| 5,636,132 A | 6/1997 | Kamdar | |
| 7,984,410 B2 * | 7/2011 | Chen et al. | 716/119 |
| 2007/0101303 A1 * | 5/2007 | Lien et al. | 716/5 |
| 2007/0118826 A1 * | 5/2007 | Lippincott | 716/10 |
| 2008/0046852 A1 * | 2/2008 | Bergman Reuter et al. | 716/10 |
| 2008/0141203 A1 * | 6/2008 | Scaman | 716/9 |

OTHER PUBLICATIONS

International Search Report for PCT/EP2008/058372, mailed Nov. 4, 2008.
Written Opinion of the International Searching Authority, for PCT/EP2008/057605, mailed Nov. 4, 2008.
Database INSPEC [online], The Institution of Electrical Engineers, Stevenage, GB; Oct. 2-3, 1983, vol. 1, No. 2-3, Schlag M et al., "An Algorithm of VLSI Layouts", XP002500733.
Liao et al., "An Algorithm to Compact a VLSI Symbolic Layout with Mixed Constraints", Design Automation, 1983. 20$^{th}$ Conference on Miami Beach, FL, USA, Jun. 27-29, 1983, Piscataway, NJ, USA, IEEE, pp. 107-112, XP010888792.

(Continued)

*Primary Examiner* — Stacy Whitmore
(74) *Attorney, Agent, or Firm* — Nixon & Vanderhye, PC

(57) ABSTRACT

A method of modification of a semiconductor layout is provided. The layout comprises objects of semiconductor material with corners and edges. The method comprises a step of receiving (61) a set of proximities, triggers and design rules, the proximities indicating relations between neighboring edges and/or corners, the triggers defining boundaries for the modification within which boundaries the proximities are valid, the design rules describing physical requirements for the semiconductor layout. The method further comprises a step of generating (62) a set of constraints, based on the received proximities, triggers and design rules, each constraint in the set of constraints defining a limit within which the semiconductor layout may be modified without changing the proximities. Then the set of constraints to obtain a modified semiconductor layout is solved (63).

9 Claims, 7 Drawing Sheets

OTHER PUBLICATIONS

Cho, "A Subjective Review of Compaction", Design Automation, 1985. 22$^{nd}$ Conference on Las Vegas, NV, USA Jun. 23-26, 1985, Piscataway, NJ, USA, IEEE, pp. 396-404, XP010889129.

Kedem et al., "Graph-Optimization Techniques for IC Layout and Compaction", Design Automation, 1983, 20$^{th}$ Conference on Miami Beach, FL, USA, Jun. 27-29, 1983, Piscataway, NJ, USA, IEEE, Jun. 27, 1983, pp. 113-120, XP010888793.

* cited by examiner

SEMICONDUCTOR LAYOUT MODIFICATION METHOD BASED ON DESIGN RULE AND USER CONSTRAINTS

This application is the U.S. national phase of International Application No. PCT/EP2008/058372, filed 30 Jun. 2008, which designated the U.S. and claims priority to European Application No. 07111309.6, filed 28 Jun. 2007, the entire contents of each of which are hereby incorporated by reference.

TECHNICAL FIELD OF THE INVENTION

The invention relates to a method for modification of a semiconductor layout. The layout comprises objects of semiconductor material with corners and edges. The method comprises receiving a description of the layout, generating equations describing an extent to which the layout may be modified and solving the equations to obtain a modified layout.

The invention further relates to a system and a computer program product for modification of a semiconductor layout.

BACKGROUND OF THE INVENTION

Semiconductor layouts comprise objects of semiconductor material, mutually connected via conducting or semiconducting material. The objects are generally polygons with edges and corners, which have coordinates in a 2-D coordinate system. The objects may be situated in different layers, making the layout a 3-D system.

Layout modification may involve, e.g., layout migration, design rule fixing or layout compaction. Layout compaction is a methodology to minimize the size of a semiconductor layout. Other modification technologies are mainly based on layout compaction, but with another optimization criterion. In a layout compaction system the main optimization criterion is the size of the layout. Optimization is performed while taking into account a set of design rules. The semiconductor layout has to fulfill several design criteria, written down as design rules and a possible additional set of (local) constraints. In 1-D compaction one changes the layout in two passes such that during the first pass edges are only moved in one dimension and such that during the second pass the edges are moved in the other dimension. During this pass the optimization problem on the layout with the given set of constraints and design rules is translated to, in general, a linear problem that can be solved with well-known algorithms.

Modifications in one dimension do however have some disadvantages. Modifications in one dimension have an effect on modifications in the other dimension. The result of 1-D modification is sub-optimal, because the problem is split into two different independent optimization problems. Furthermore, the result of the modification operation is dependent on which dimension is modified first and 2-D design rules and constraints are not taken into account.

U.S. patent application, published as US 2003/009728 and filed by David P. Marple, describes a 2-D compaction method that allows for horizontal, vertical and diagonal constraints. Diagonal constraints are non-linear in nature and therefore very difficult to solve. For enabling performing the compaction, a linear approximation of the non-linear constraints is used. Then the 2-D compaction problem is solved with a linear solver. If, after compaction, the linearization of the non-linear function appears not to be a good estimate, some additional iteration is performed to correct the layout.

It is a problem of the method of Marple and other 2-D compaction methods, that the 2-D compaction gives a lot of moving freedom and therefore it is difficult to "predict" which layout objects will be neighbors in the output result. Neighbors need to be constrained, like a minimal distance between them. So, if, in theory, every object can become a neighbor of every other object, one has to apply constraints between all pairs of layout objects. Therefore the order of the number of constraints is quadratic in the number of layout objects. With the large chip designs that we have today, this would result in a large number of constraints such that the problem becomes too large for today's computers and memories.

SUMMARY OF THE INVENTION

It is an object of the current invention to provide a method for modification of a semiconductor layout, which method is suitable for 2-D layout modification and uses a reasonable number of constraints. 'Reasonable' herein means that the number of constraints is significantly less than in quadratic order of the number of layout objects.

According to a first aspect of the invention, this object is achieved by providing a method of modification of a semiconductor layout, the layout comprising objects of semiconductor material with corners and edges. The method comprises a step of receiving a set of proximities, triggers and design rules, the proximities indicating relations between neighboring edges and/or corners, the triggers defining boundaries for the modification within which boundaries the proximities are valid, the design rules describing physical requirements for the semiconductor layout, a step of generating a set of constraints, based on the received proximities, triggers and design rules, each constraint in the set of constraints defining a limit within which the semiconductor layout may be modified without changing the proximities, and a step of solving the set of constraints to obtain a modified semiconductor layout.

Proximities are relations between neighboring edges and/or corners. Triggers describe within which boundaries the layout can change and within which boundaries the current set of proximities is valid. Because proximities are only defined between direct neighbors, the number of relations is kept relatively small and linear with the number of objects. The European patent application No. 07104863 describes a method and system for scanning a semiconductor layout and storing proximities and triggers in a database. Said patent application also provides an extensive description of proximities and triggers, which is hereby included by reference.

When applying design rules to the proximities, constraints are obtained. An exemplary design rule may define a minimum space between two objects. The proximity set defines positions in the layout where such a design rule must be applied. A proximity, layout information relating to the proximity and the design rule to be applied to it, together result in a constraint.

Constraints also originate from triggers. The triggers define the boundaries within which the set of proximities provides a valid description of the topology of the layout. By generating constraints based on the triggers, it is guaranteed that the proximity set remains valid after the layout modification. Consequently, relations between objects that are not direct neighbors in the original layout do not have to be taken into account. This makes the set of constraints to solve relatively small. The set of constraints, derived from the proximities, triggers and design rules, is then solved and the solution describes the modified layout.

A preferred embodiment of the method according to the invention further comprises a step of identifying at least one critical constraint, the critical constraint prohibiting further optimization of the semiconductor layout by limiting a freedom of movement for a particular one of the objects, a step of adapting at least one of the triggers in order to increase the freedom of movement for the particular one of the objects, a step of regenerating the set of constraints, based on the adapted trigger, and a step of solving the regenerated set of constraints.

With the method of the invention, objects in the semiconductor layout are moved from a start position to an end position. The modification stops when further optimization within the current set of constraints is not possible anymore. The constraints ensure that the objects are not moved to positions where design rules are violated or where the initial proximity set is not valid. When the modification stops, one or more objects may have been moved to a position where they almost break a design rule or pass a trigger. Those constraints that prohibit further layout optimization are called 'critical constraints'. A list with all critical constraints is called the 'critical path'. The set of proximities and triggers may then be changed to remove at least one of these critical constraints and to provide more freedom of movement. Preferably, the constraint set is changed by first removing or changing a trigger that causes a critical constraint. Changing a trigger results in more freedom of movement or, at least, more freedom of movement in a preferred direction. Then the set of proximities is adapted to include proximity relations between objects that may become direct neighbors when using the new freedom of movement. For this purpose, the area around the changed or omitted trigger is inspected for changes in the proximity set. Some proximities may not be relevant anymore and may therefore be removed. From the new set of proximities and triggers a new set of constraints is generated. Preferably, the adapting of the triggers, proximities, and/or constraints is only performed locally around the critical path to avoid unnecessary calculations. The changed constraint set is then solved for obtaining an even better layout. Preferably, the solution to the previous set of constraints is used as a basis for solving the next set of claims. The local adapting of triggers and proximities and regenerating of constraints and the solving of the regenerated set of constraints is preferably repeated until a layout configuration is obtained that meets a predetermined target value of the optimization criterion. The adaptations are preferably performed by an automated system, but may also require an operator making decisions and instructing the system to apply one or more of the adaptations.

According to a second aspect of the invention, a system is provided, for modification of a semiconductor layout, the layout comprising objects of semiconductor material with corners and edges. The system comprises an input and a processor. The input is arranged for receiving a set of proximities, triggers and design rules, the proximities indicating relations between neighboring edges and/or corners, the triggers defining boundaries for the modification within which boundaries the proximities are valid, the design rules describing physical requirements of the semiconductor layout. The processor is arranged for generating a set of constraints, based on the received proximities, triggers and design rules, each constraint in the set of constraints defining a limit within which the semiconductor layout may be modified without changing the proximities, and solving the set of constraints to obtain a modified semiconductor layout.

DETAILED DESCRIPTION OF THE INVENTION

Figure 1:
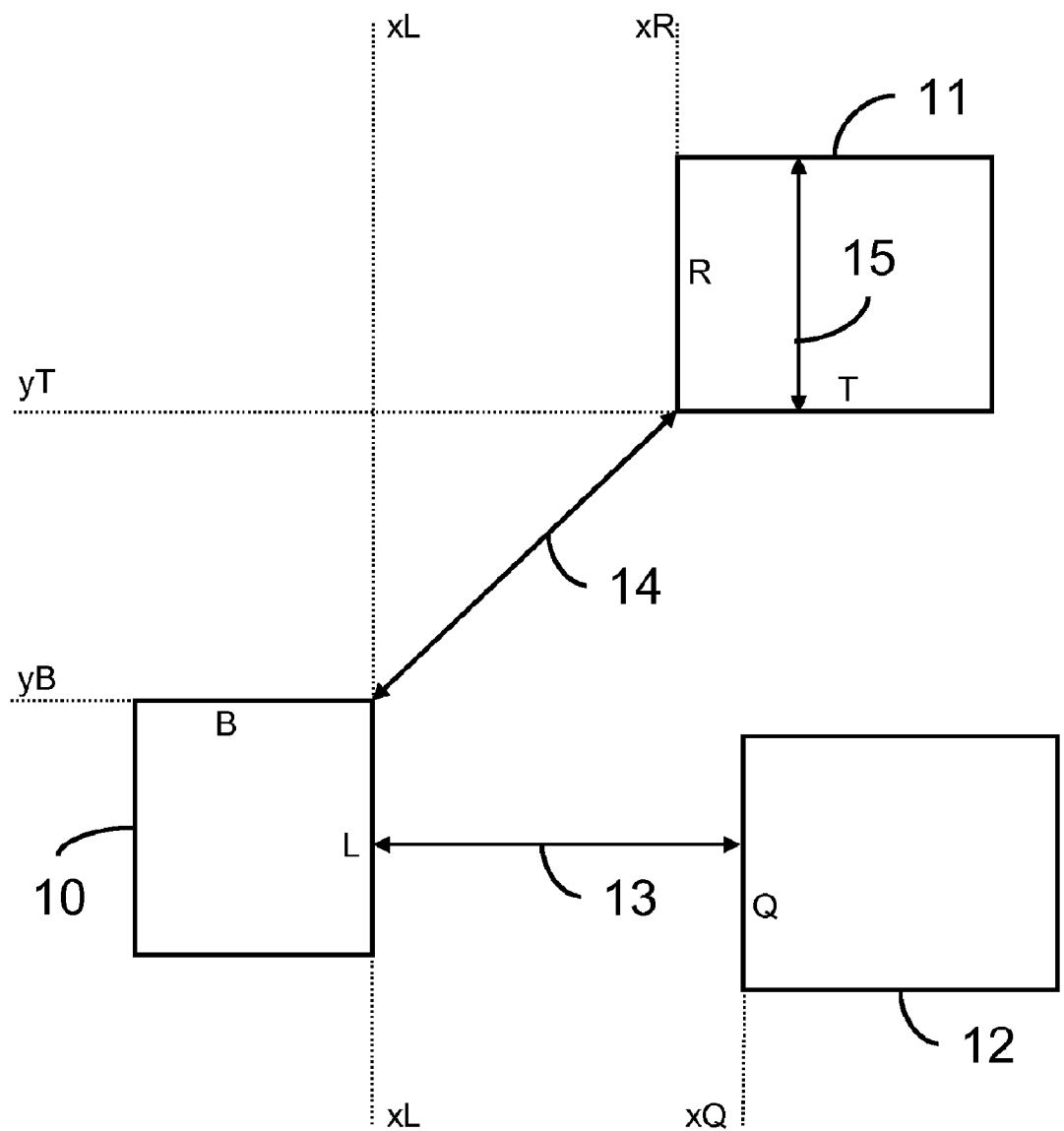
FIG. 1 shows a part of a semiconductor layout with three objects.

FIG. 1 shows a part of a 2-D semiconductor layout with three objects (10, 11, 12). Depending on their function, the objects (10, 11, 12) may be of conducting, semi-conducting or insulating material. The layout may, e.g., comprise transistors, wires, resistors, capacitors and the like. In FIG. 1, the objects are represented as polygons. In accordance with the method described in the European patent application No. 07104863, the topology of the layout is stored in a database with edges and proximities. Proximities (13, 14, 15) are relations between edges or corners that are direct neighbors. FIG. 1 shows part of the proximity relations (13, 14, 15) between edges and corners of the shown objects (10, 11, 12).

The method according to the invention takes advantage of the fact that interactions between direct neighbors are far more significant than interactions between other objects. When modifying a layout, especially the effects on the interactions between direct neighbors are considered. The layout modification system receives the set of proximities from the database and analyzes the proximities to find instances of design rules. For example, a design rule may specify a minimum distance between edges of two objects (10, 12). The proximity database comprises a proximity 13, between such edges. By analyzing the proximity set an instance of the design rule is found between edges L and Q. A constraint is generated, restricting the movement of the edges L and Q relative to each other. After analysis of the layout, the obtained set of constraints is solved to obtain a modified layout that does not violate the constraints and consequently also not the design rules.

FIG. 1 also shows a proximity 14 between two diagonally opposing corners of edges L and R. A design rule for the distance between two diagonally opposing edges may specify a minimum distance of 100 nm in both directions (x and y). Combining of the proximity relation 14 and the design rule may result in the following two constraints:

$$xR - xL >= 100$$

$$yT - yB >= 100$$

FIG. 1 further shows a proximity 15 between two opposing edges of one object 11. A design rule for the minimum and/or maximum width of the object 11 results in a constraint that limits the freedom of movement of the edges.

Figure 2:
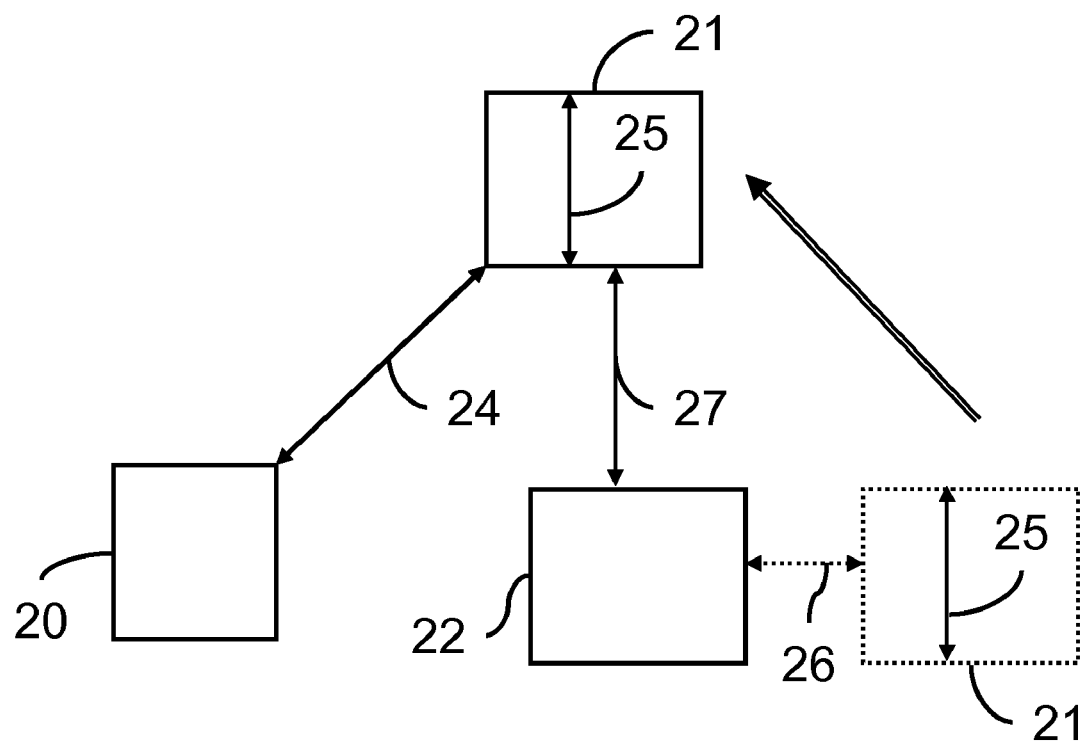
FIG. 2 shows a modification of a semiconductor layout.

Constraints are not derived from design rules only. FIG. 2 shows a modification of a semiconductor layout. In a first situation object 22 is situated between the objects 20 and 21. A proximity relation 26 exists between neighboring edges of the objects 21 and 22. When object 21 is moved to its new position proximity 26 disappears because the corresponding edges are no longer direct neighbors. Additionally, new triggers 24 and 27 are needed to define the new relations of edges or corners of object 21 with edges or corners of objects 20 and 22. The proximity relation 25 within the object 21 is unaffected by the movement of the object 21 to its new position. When object 21 moves beyond object 22, it gets closer to object 20. In the first situation, there is no proximity applied between object 20 and 21 and thus also no constraint is generated which prevents object 21 from moving too close to object 20.

To prevent the possibility of design rule violations when moving object 21, the freedom of movement of the object 21 must be limited. This is implemented by adding additional constraints, based on triggers. A trigger defines a limit for a layout change beyond which limit a corresponding proximity becomes invalid and the topology of the layout is changed. Triggers are determined based on the stored proximities and the relative positions of the corresponding edges and corners. According to the invention, the triggers may be received from the database, together with the proximities. Alternatively, the triggers are generated from the received layout information as part of the method for layout modification.

Figure 3:
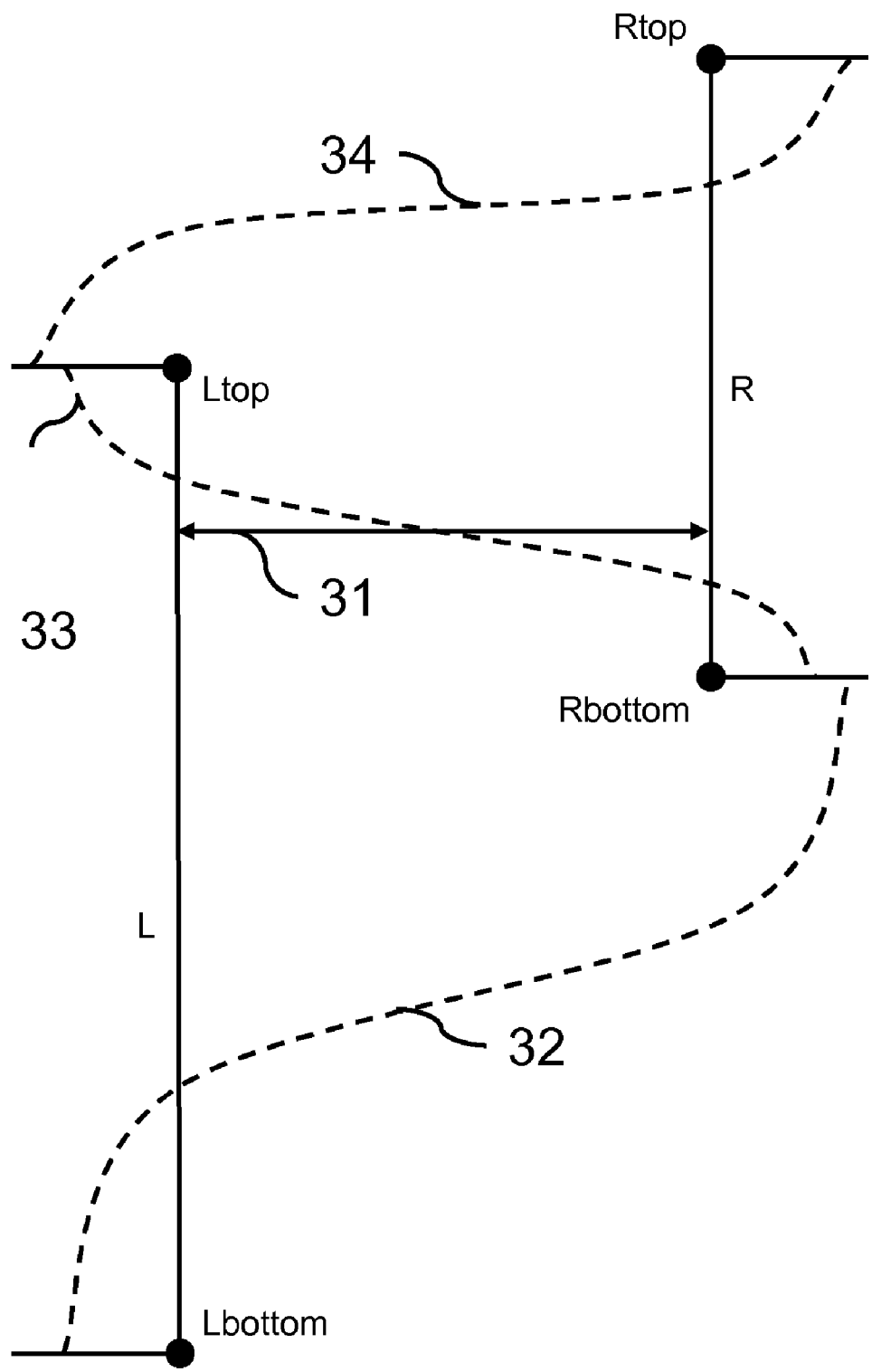
FIG. 3 shows two neighboring edges of objects in a semiconductor layout.

FIG. 3 shows two neighboring edges, L and R, of objects in a semiconductor layout, together with associated proximities 31 and triggers 32, 33, 34. A first constraint may be generated based on the proximity 31 and a design rule:

$$xR-xL>=50$$

This first constraint prevents the edges R and L from coming too close to each other. When, e.g., edge R moves up beyond corner Ltop, the proximity 31 disappears and the topology of the layout is changed. This can be prevented by defining trigger 33 and deriving a constraint from the trigger 33 and the corresponding edges:

$$yR\text{bottom}<=yL\text{top}$$

Additional constraints may keep corner Rtop above Ltop and Rbottom above Lbottom:

$$yR\text{top}>=yL\text{top}$$

$$yR\text{bottom}>=yL\text{bottom}$$

The last constraint is only necessary if the length of edge L is variable. If the height of edge L remains constant, the third constraint (yRtop>=yLtop) also prevents the corner Rbottom from moving below Lbottom.

Figure 4:
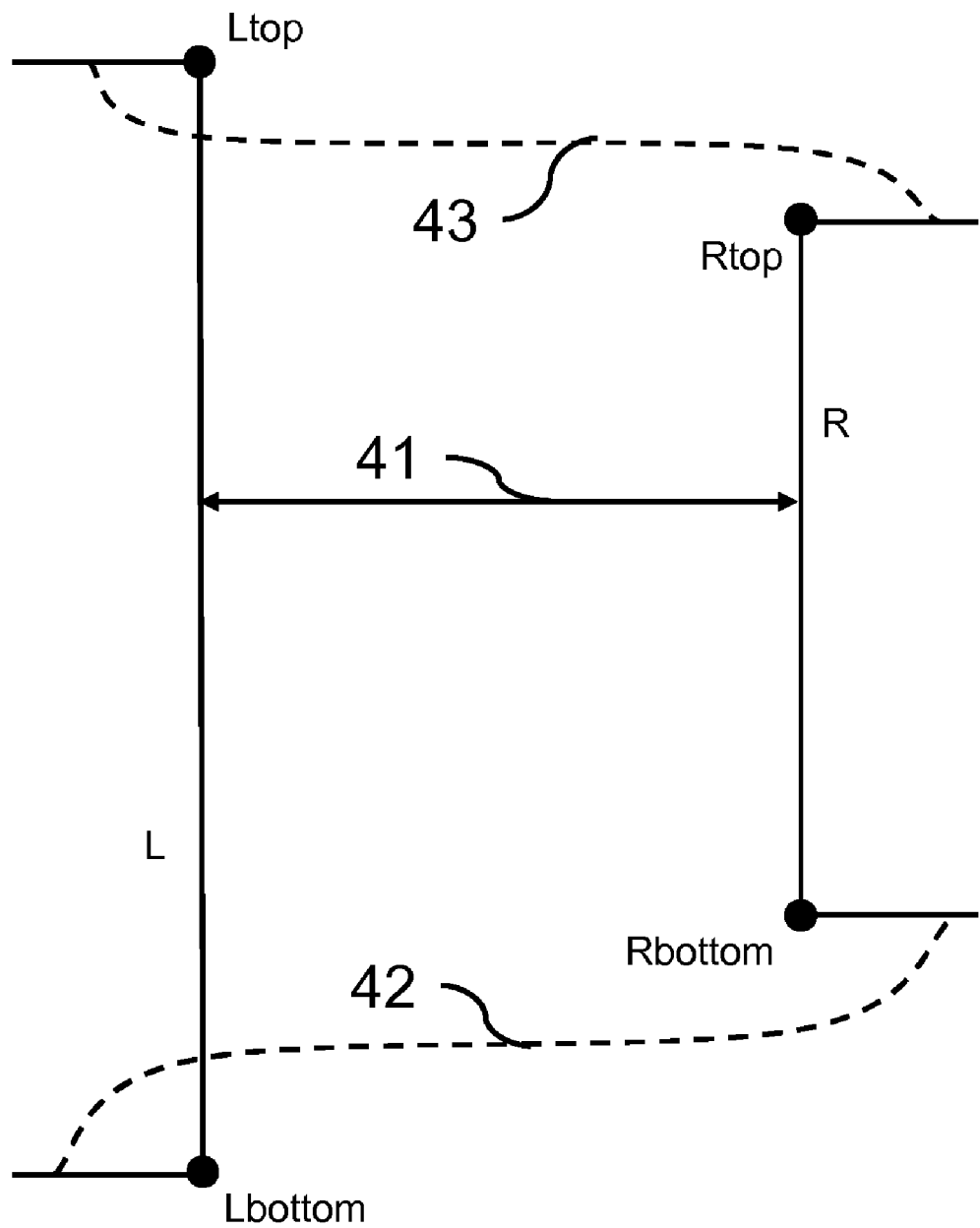
FIG. 4 shows two neighboring edges of objects in a semiconductor layout.

FIG. 4 shows another situation with two neighboring edges, L and R, of objects in a semiconductor layout, together with associated proximities 41 and triggers 42, 43. The following three constraints guarantee that the whole of edge R remains at the right side and opposite to edge L, at a minimum distance of 50 nm:

$$yR\text{top}<=yL\text{top}$$

$$yR\text{bottom}>=yL\text{bottom}$$

$$xR-xL>=50$$

Figure 5:
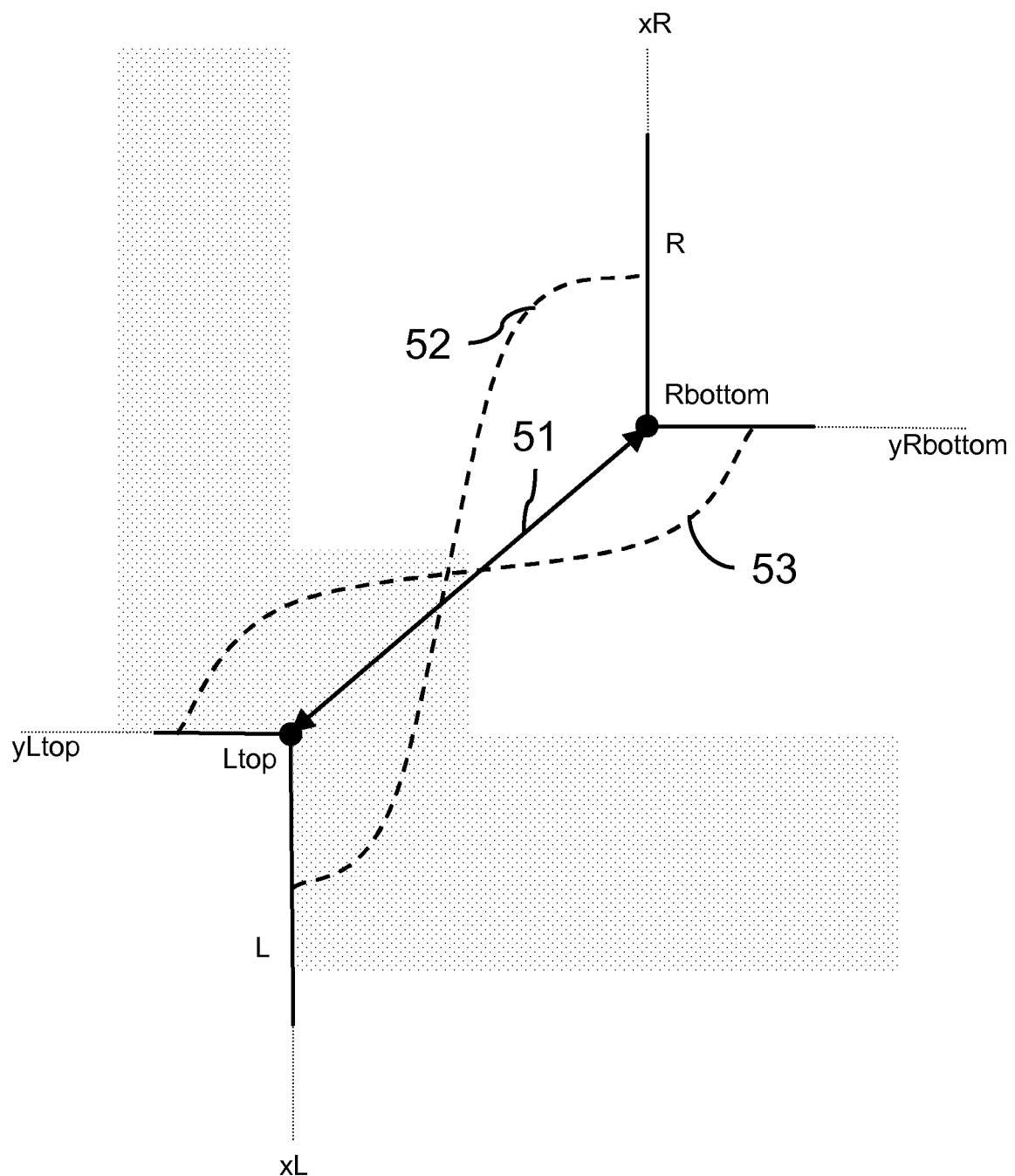
FIG. 5 shows two diagonally opposite corners of objects in a semiconductor layout.

FIG. 5 shows two diagonally opposite corners, Ltop and Rbottom, of objects in a semiconductor layout, together with associated proximities 51 and triggers 52, 53. To keep Rbottom diagonally above Ltop, the following two constraints are sufficient:

$$xR>xL$$

$$yR\text{bottom}>yL\text{top}$$

These constraints originate from triggers 52 and 53 respectively. A design rule may additionally specify that a minimum distance in at least one direction is, e.g., 40 nm. This design rule results in the following two constraints of which at least one can not be violated:

$$xR-xL>=40$$

$$yR\text{bottom}-yL\text{top}>=40$$

The shaded area in FIG. 5 shows the area where corner Rbottom would violate one of the above mentioned constraints. In the case of Euclidian distance rules these last two equations are suboptimal and a possibly smaller result can be obtained with Euclidian (quadratic) distance equations. Quadratic equations may be solved using a non-linear solver or by first linearizing the quadratic equations (like in US 2003/0009728).

Figure 6:
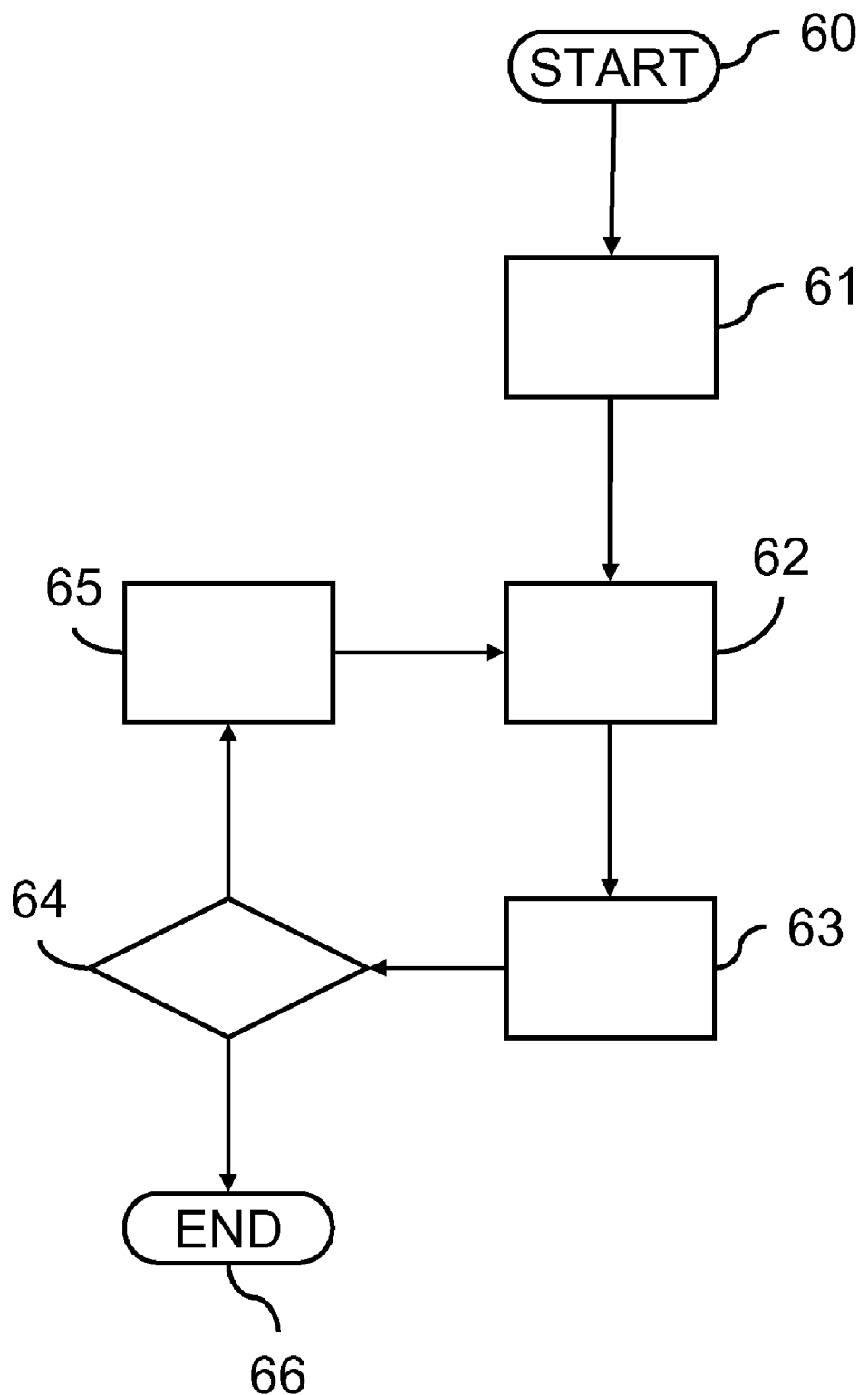
FIG. 6 shows a flow diagram of an embodiment of the method according to the invention.

FIG. 6 shows a flow diagram of an embodiment of the method according to the invention. During an initiation step 60, some starting parameters are defined. Such starting parameters may include the type of modification problem to be solved (e.g. compaction, migration), layout size, output preferences, storage location of the input data, etc.

At data input step 61, the layout modification system receives a set of proximities, triggers and design rules. The proximities may be obtained from a database, stored in the system itself after scanning the layout. Alternatively, the scanning of the layout may be performed by a separate system and the proximity data may be obtained from an external source. Together with the proximities between edges, information may be stored about the material and topology of the position where the proximity is applied. Such information, may include a type definition of the proximity relation (space, width, extend, overlap). Triggers may be received together with the proximities or the system may determine the triggers based on the received proximities and other layout information. Proximities and triggers are information describing the topology of the layout. The system also receives design rules. Specific design rules for the planned modification may be provided by the manufacturer of the semiconductor chip or a standard design rule set may be used.

In a constraint generating step 62, the information received at data input step 61 is processed. The system searches through the set of proximities to find instances of the design rules. At positions where a design rule should be applied, an equation is formulated that limits the freedom of movement of the edges corresponding to the proximity relation at that position. As described above, with reference to FIGS. 3, 4 and 5, equations are also derived from triggers. The set of equations is complemented with an optimization function depending on the purpose of the layout modification operation. In a layout compaction system the main optimization criterion is the size of the layout.

In solving step 63 the equations may be solved with one dimensional or two dimensional layout changes. The solving step 63 ends when, within the current set of constraints, the optimization criterion is met. For example, layout compaction ends when no layout change can further reduce the size of the layout without violating the constraints.

The solving generally stops at a point where one or more constraints limit movement of one or more objects in a preferred direction. For example, during compacting a layout, a first object is moved down from 70 nm above a second object to 50 nm above the second object. A design rule may prescribe a minimal distance of 50 nm between the two objects. The constraint corresponding to the design rule and the objects then prohibits moving the first object any lower. The constraint is therefore called a tight constraint. If no further layout changes can reduce the size of the layout, without violating the constraints, the solver stops. Those tight constraints that prohibit further layout optimization are called 'critical constraint'.

In result analysis step 64, the critical constraints are identified and a list of all critical constraints (hereinafter called 'critical path') is made. Some of the tight constraints on the will be distance constraints originating from design rules. Unless the design rules are changed, these constraints can not be removed. In general, design rules are fixed rules that should not be changed. However sometimes, design rules may lead to conflicting constraints that can not be met simultaneously. The system, optionally after querying a user, may decide to change or delete the design rule. The design rule may be changed at some specific locations in the layout only. Other critical constraints are caused by triggers. The triggers have no relation to design rules and do not necessarily result in design rule violations if omitted. After omitting or changing (part of) these triggers, the freedom of movement of the layout objects changes and the layout may be modified beyond the original limitations. Moving objects beyond the original boundaries may result in further optimization of the layout.

Triggers define the boundaries between which a proximity set is valid. After deleting or changing a trigger there may be room for layout changes. To safely change the layout without introducing design rule violations new proximities and constraints need to be created according to the used criterion and redundant ones need to be deleted. In adapting step 65, the consequences the trigger adjustments are calculated. Preferably the adapting of the proximities is only performed locally, in the neighborhood of the changed trigger. By only adapting the proximity set locally, a time intensive complete layout scan is avoided. A good way to select an area to re-scan after removing/changing a trigger, is to only consider objects associated with the trigger and direct neighbors of these objects. It is to be noted that the layout is not modified during the adapting step 65, only the proximities, triggers and constraints are.

The adapted set of proximities and triggers, optionally together with a set of adapted design rules is then used to repeat the constraint generating step 62 with the adapted information as input data. The regenerated constraints set is then solved in solving step 63 and the results are analyzed in result analysis step 64. This iterative process is repeated until the modification has resulted in the desired result or until further optimization of the layout is not possible anymore.

Figure 7:
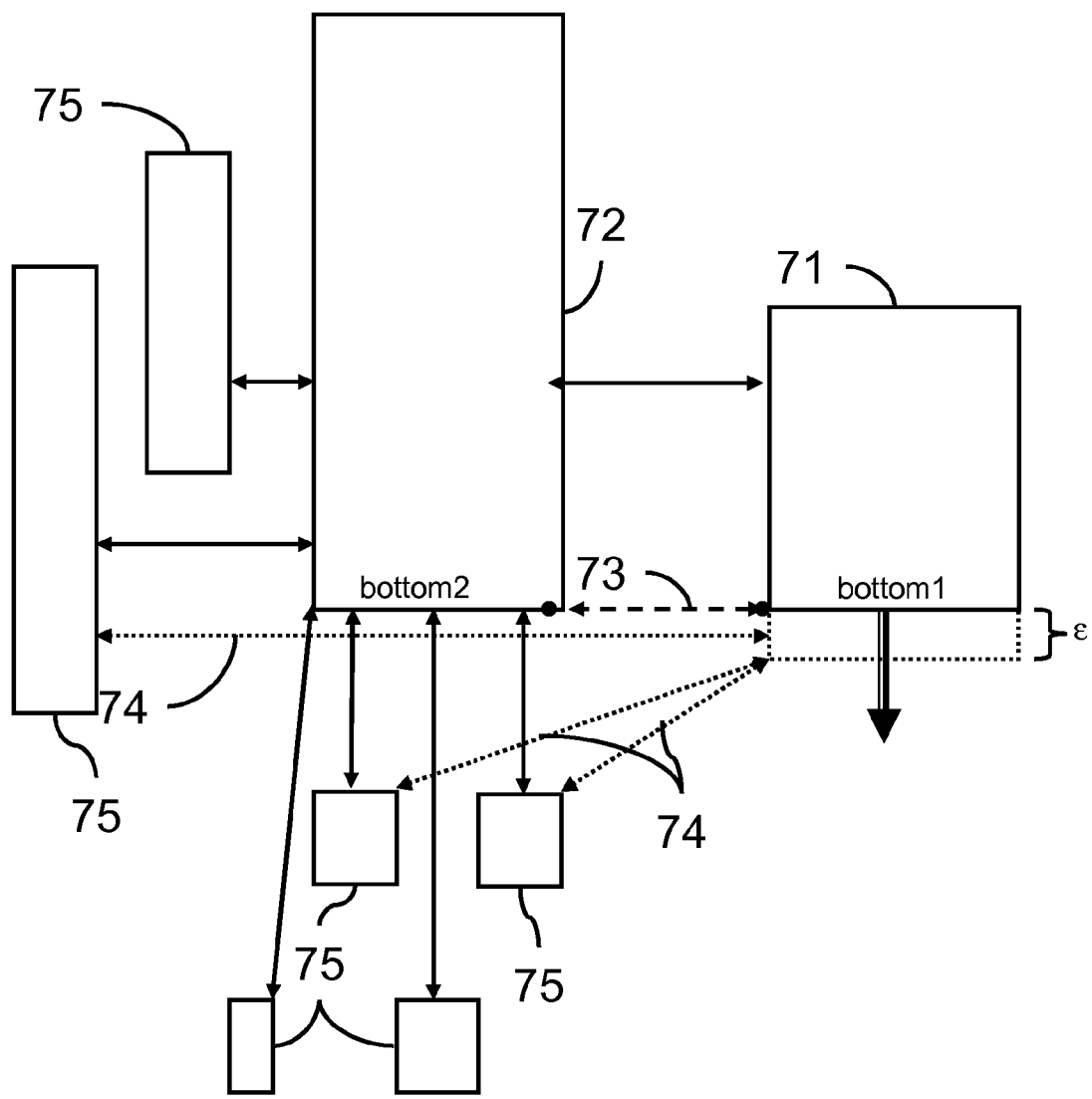
FIG. 7 shows an example of adapting triggers and proximities after modification of a semiconductor layout.

FIG. 7 shows an example of adapting triggers and proximities after modification of a semiconductor layout. In this exemplary embodiment of the method according to the invention, a first object 71 is moving down parallel to a second object 72. A constraint originating from a trigger 73 keeps the bottom edge of the first object 71 above the bottom edge of the second object 72. As a result, the first object 71 is kept at the right side of the second object 72. After the modification routine according to the invention is performed once, the first object 71 has been moved down exactly to the point where the bottom edge of the first object 71 is at the same height as the bottom right edge of the second object 72. If the first object 71 would be moved down any further, the original proximities set would not be valid anymore. If the constraint originating from this trigger 73 is on the 'critical path', i.e. it prohibits further optimization of the layout, then it is critical constraint and it may be better to remove or change it.

Moving down the first object 71 even further down and therewith violating the constraint, would not immediately result in a design rule violation. Consequently, the trigger 73 may be changed or removed. In this event, the original constraint (bottom2<=bottom1) is changed to a new constraint (bottom2>=bottom1) and the bottom edge of the first object 71 is allowed to move below the bottom edge of the second object 72. Moving the first object 71 beyond the original constraint does however result in multiple new proximity relations 74. In order to avoid the first object 71 moving too close to objects situated below the second object 72, new constraints are generated based on these new proximity relations 74. For that purpose, the assumption is used that the first object 71 has moved an infinitely small distance epsilon ($\epsilon$) below L which would require the extra proximities 74. Preferably, the scanning for new proximities and triggers and the generating of new constraints is only performed locally, in the vicinity of the removed/changed trigger. For example, only the objects 71 and 72, corresponding to the changing trigger and the direct neighbors 74, 75 of said objects 71, 72 are considered when adapting the set of constraints. It is to be noted that the layout is not modified during the adapting of the topology, only the proximities, triggers and constraints are.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the claims enumerating several means, several of these means may be embodied by one and the same item of hardware. The mere fact that certain measures are recited in mutually different dependent claims does not indicate that a combination of these measures cannot be used to advantage.

The invention claimed is:

1. A method of modifying a semiconductor layout, the layout comprising objects of semiconductor material with corners and edges, the method comprising steps of:
   receiving at an input data representative of a set of proximities, triggers and design rules, the proximities indicating relations between neighboring edges and/or corners, the triggers defining boundaries for the modification within which boundaries the proximities are valid, a valid proximity indicating relations between edges or corners that are still direct neighbors, the design rules describing physical requirements for the semiconductor layout,
   generating with a computer, from the input data, a set of constraints, based on the received set of proximities, triggers and design rules, each constraint in the set of constraints defining a limit within which the semiconductor layout may be modified without changing the proximities,
   solving with the computer the set of constraints to obtain a modified semiconductor layout, and
   moving objects in the semiconductor layout based on the modified semiconductor layout obtained by the computer solving the set of constraints.

2. The method as claimed in claim 1, further comprising having the computer:
   identify at least one critical constraint, the critical constraint prohibiting further optimization of the semiconductor layout by limiting a freedom of movement for a particular one of the objects, adapt at least one of the triggers in order to increase the freedom of movement for the particular one of the objects, regenerate the set of constraints, based on the adapted trigger, and solve the regenerated set of constraints.

3. The method as claimed in claim 2, wherein the steps of identifying, adapting, regenerating and solving are performed iteratively until a predetermined optimization criterion is met.

4. The method as claimed in claim 2, wherein the adapting comprises removing, changing or adding a trigger.

5. The method as claimed in claim 4, wherein the adapting further comprises adding or removing proximities for an edge related to the removed, changed or added trigger.

6. The method as claimed in claim 1, wherein the modification results in a two dimensional movement of the objects comprising the layout.

7. The method as claimed in claim 1, wherein solving the set of constraints comprises applying a predetermined optimization function for minimizing a size of the layout after the modification.

8. A non-transitory computer readable medium comprising a computer program for modification of a semiconductor layout, which program is operative to cause the computer to perform the method as claimed in claim 1.

9. A system for modifying a semiconductor layout, the layout comprising objects of semiconductor material with corners and edges, the system comprising:

an input for receiving a set of proximities, triggers and design rules, the proximities indicating relations between directly neighboring edges and/or corners, the triggers defining boundaries for the modification within which boundaries the proximities are valid, a valid proximity indicating relations between edges or corners that are still direct neighbors, the design rules describing physical requirements of the semiconductor layout, and a processor being arranged for:

generating a set of constraints, based on the received proximities, triggers and design rules, each constraint in the set of constraints defining a limit within which the semiconductor layout may be modified without changing the proximities, and solving the set of constraints to obtain a modified semiconductor layout.

* * * * *